United States Patent
Lin et al.

(10) Patent No.: US 9,035,445 B2
(45) Date of Patent: May 19, 2015

(54) SEAL RING STRUCTURE WITH A METAL PAD

(71) Applicant: TAIWAN SEMICONDUCTOR MANUFACTURING COMPANY, LTD., Hsin-Chu (TW)

(72) Inventors: Jeng-Shyan Lin, Tainan (TW); Dun-Nian Yaung, Taipei (TW); Jen-Cheng Liu, Hsin-Chu (TW); Hsin-Hui Lee, Kaohsiung (TW); Wen-De Wang, Minsyong Township, Chiayi County (TW); Shu-Ting Tsai, Kaohsiung (TW)

(73) Assignee: Taiwan Semicondutor Manufacturing Company, Ltd., Hsin-Chu (TW)

( * ) Notice: Subject to any disclaimer, the term of this patent is extended or adjusted under 35 U.S.C. 154(b) by 75 days.

(21) Appl. No.: 13/624,938

(22) Filed: Sep. 23, 2012

(65) Prior Publication Data

US 2013/0082346 A1  Apr. 4, 2013

Related U.S. Application Data

(62) Division of application No. 12/916,789, filed on Nov. 1, 2010, now Pat. No. 8,283,754.

(60) Provisional application No. 61/373,634, filed on Aug. 13, 2010.

(51) Int. Cl.
*H01L 21/78* (2006.01)
*H01L 23/488* (2006.01)
(Continued)

(52) U.S. Cl.
CPC .......... *H01L 23/488* (2013.01); *H01L 21/6835* (2013.01); *H01L 23/3192* (2013.01);
(Continued)

(58) Field of Classification Search
USPC .......... 257/686, 690, E23.141; 438/109, 121
See application file for complete search history.

(56) References Cited

U.S. PATENT DOCUMENTS 7,332,751 B2   2/2008   Iguchi
7,638,852 B2   12/2009  Hsu et al.
(Continued)

FOREIGN PATENT DOCUMENTS

DE   10 2011 004 238   3/2012
JP   2007027324        2/2007
JP   2008270488        11/2008

OTHER PUBLICATIONS

Korean Intellectual Property Office, Decision for Patent dated Jul. 31, 2012, Application No. 10-2011-0021945, 3 pages.
(Continued)

*Primary Examiner* — S. V. Clark
*Assistant Examiner* — Krista Soderholm
(74) *Attorney, Agent, or Firm* — Haynes and Boone, LLP (57) ABSTRACT

A method includes providing a substrate having a seal ring region and a circuit region, forming a seal ring structure over the seal ring region, forming a first frontside passivation layer above the seal ring structure, etching a frontside aperture in the first frontside passivation layer adjacent to an exterior portion of the seal ring structure, forming a frontside metal pad in the frontside aperture to couple the frontside metal pad to the exterior portion of the seal ring structure, forming a first backside passivation layer below the seal ring structure, etching a backside aperture in the first backside passivation layer adjacent to the exterior portion of the seal ring structure, and forming a backside metal pad in the backside aperture to couple the backside metal pad to the exterior portion of the seal ring structure. Semiconductor devices fabricated by such a method are also provided.

20 Claims, 8 Drawing Sheets

(51) Int. Cl.
  *H01L 21/683* (2006.01)
  *H01L 23/00* (2006.01)
  *H01L 23/58* (2006.01)
  *H01L 27/146* (2006.01)
  *H01L 21/02* (2006.01)
  *H01L 23/31* (2006.01)

(52) U.S. Cl.
  CPC ............ *H01L23/564* (2013.01); *H01L 23/585* (2013.01); *H01L 24/03* (2013.01); *H01L 24/05* (2013.01); *H01L 24/06* (2013.01); *H01L 27/14618* (2013.01); *H01L 27/14636* (2013.01); *H01L 27/1464* (2013.01); *H01L 2221/68304* (2013.01); *H01L 2221/68327* (2013.01); *H01L 2221/6834* (2013.01); *H01L 2221/68363* (2013.01); *H01L 2224/03* (2013.01); *H01L 2224/0345* (2013.01); *H01L 2224/03452* (2013.01); *H01L 2224/0361* (2013.01); *H01L 2224/0362* (2013.01); *H01L 2224/05624* (2013.01); *H01L 2224/05647* (2013.01); *H01L 2224/05666* (2013.01); *H01L 2224/05684* (2013.01); *H01L 2224/0603* (2013.01); *H01L 2224/06181* (2013.01); *H01L 2924/01019* (2013.01); *H01L 2924/01068* (2013.01); *H01L 21/02697* (2013.01)

(56) References Cited

U.S. PATENT DOCUMENTS

| | | | |
|---|---|---|---|
| 7,656,000 | B2 | 2/2010 | Hsu et al. |
| 7,799,654 | B2 | 9/2010 | Hsieh et al. |
| 7,821,104 | B2 * | 10/2010 | Lee et al. ............ 257/620 |
| 8,053,856 | B1 | 11/2011 | Tu et al. |
| 8,476,769 | B2 * | 7/2013 | Chen et al. ............ 257/774 |
| 2007/0001100 | A1 | 1/2007 | Hsu et al. |
| 2007/0170591 | A1 | 7/2007 | Yamanoue et al. |
| 2010/0052106 | A1 | 3/2010 | Lee et al. |
| 2010/0193928 | A1 | 8/2010 | Zudock et al. |
| 2011/0204505 | A1 * | 8/2011 | Pagaila et al. ............ 257/686 |

OTHER PUBLICATIONS

Madelung, O., et al., Landolt-Bornstein Numerical Data and Functional Relationships in Science and Technology new Series, Group III: condensed Matter, vol. 41, Semiconductors, Springer, 2002.

* cited by examiner

SEAL RING STRUCTURE WITH A METAL PAD

PRIORITY DATA

The present application is a divisional application of U.S. patent application Ser. No. 12/916,789, filed Nov. 1, 2010, which claims priority to U.S. Provisional Application Ser. No. 61/373,634, filed Aug. 13, 2010, the entire disclosures of which are incorporated herein by reference in their entirety.

BACKGROUND

The design and packaging of semiconductor integrated circuits (ICs), there are several areas of concern. Moisture needs to be prevented from entering the circuits because: (1) moisture can be trapped in oxides and increase the dielectric constant thereof; (2) moisture can create trapped charge centers in gate oxides causing threshold voltage shifts in complementary metal-oxide-semiconductor (CMOS) transistors; (3) moisture can create interface states at the Si-gate oxide interface causing degradation in the transistor lifetime through increased hot-electron susceptibility; (4) moisture can cause corrosion of the metal interconnect, reducing the reliability of the IC; and (5) when trapped in Si-oxide, moisture can reduce the oxide mechanical strength and the oxide may become more prone to cracking due to tensile stress. Ionic contaminants can also cause damage to the IC as they can diffuse rapidly in silicon oxide. For instance, ionic contaminants can cause threshold voltage instability in CMOS transistors and alter the surface potential of the Si surface in the vicinity of the ionic contaminants. Dicing processes that separate adjacent IC dies from one another may also cause potential damage to the IC.

A seal ring has been used in the industry to protect the IC from moisture degradation, ionic contamination, and dicing processes, but improvement has been desirable. In particular, a dicing process using a mechanical die saw may cause peeling of layers from the die saw cutting forces. Backside illuminated devices having inter-metal or interlayer dielectric films with low dielectric constants (low-k) are especially prone to die saw peeling. Accordingly, improved methods of semiconductor device fabrication and devices fabricated by such methods are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
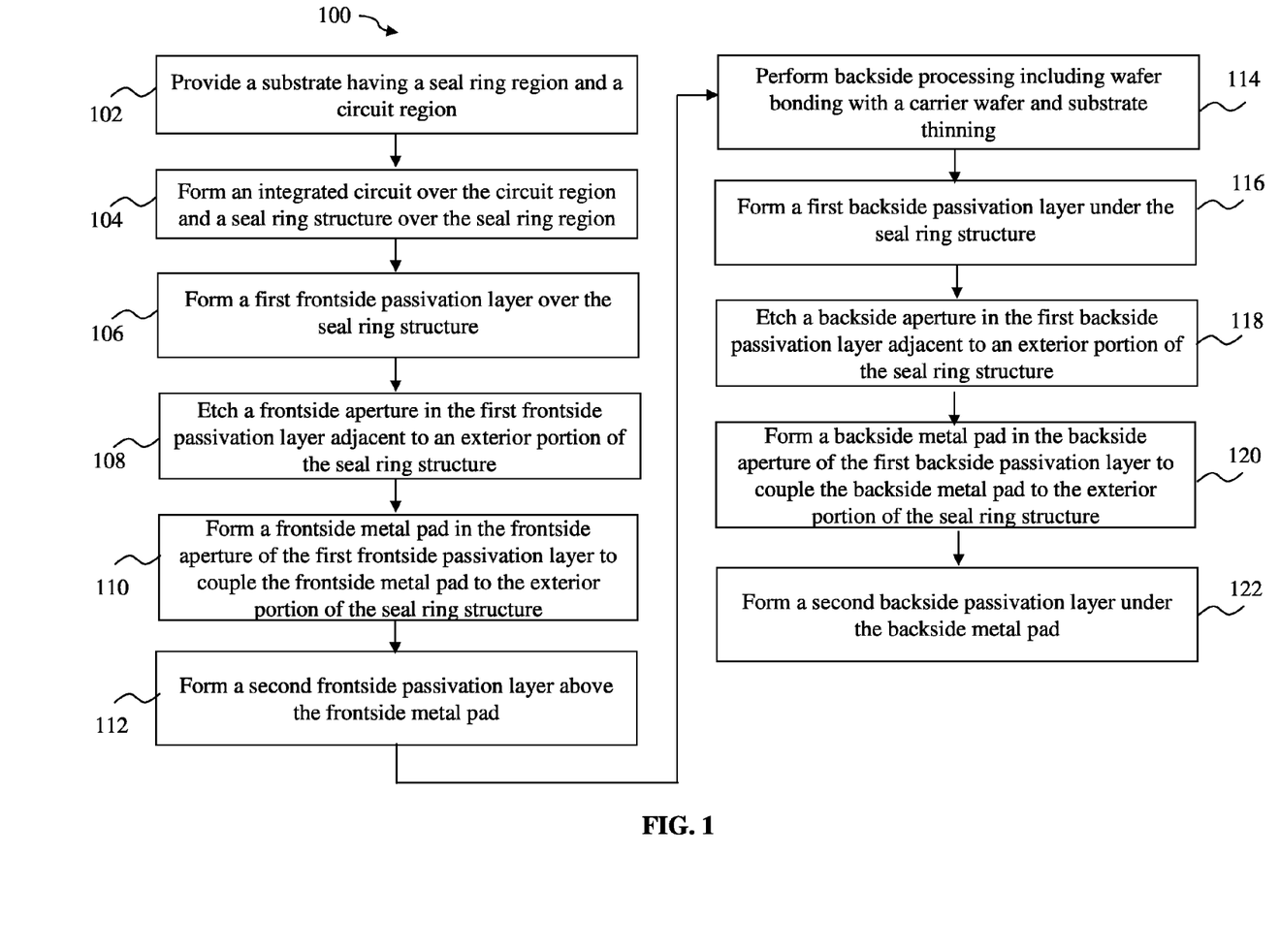
FIG. 1 is a flowchart illustrating a method for fabricating a semiconductor device with a seal ring structure having a metal pad for preventing die saw peeling according to various aspects of the present disclosure.
Figure 2:
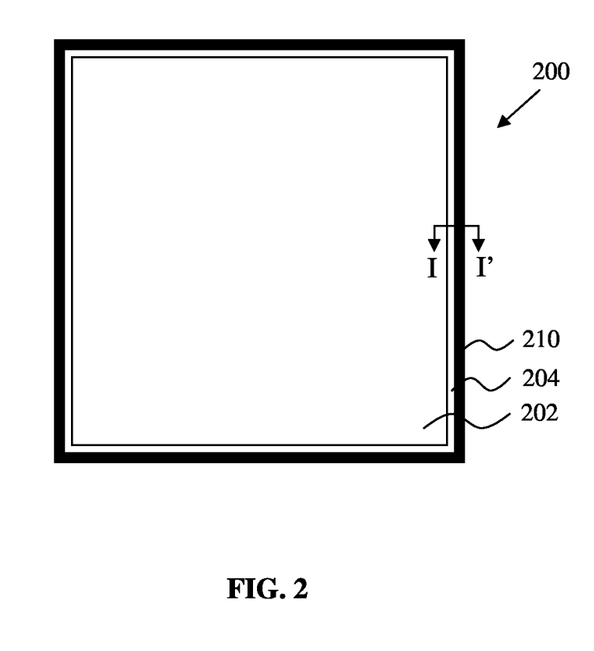
FIG. 2 is a top plan view of an integrated circuit (IC) die with a seal ring structure according to various aspects of the present disclosure.
Figure 3A:
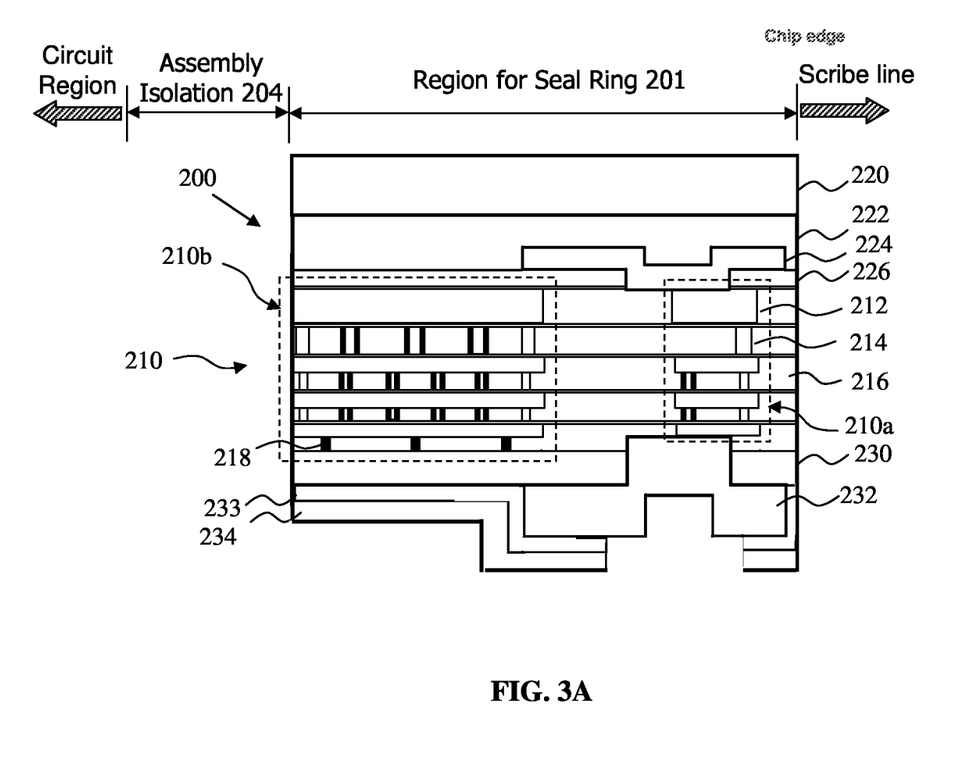
FIGS. 3A and 3B are cross-sectional views along line I-I' in FIG. 2 of alternative seal ring sections according to various aspects of the present disclosure.
Figure 3B:
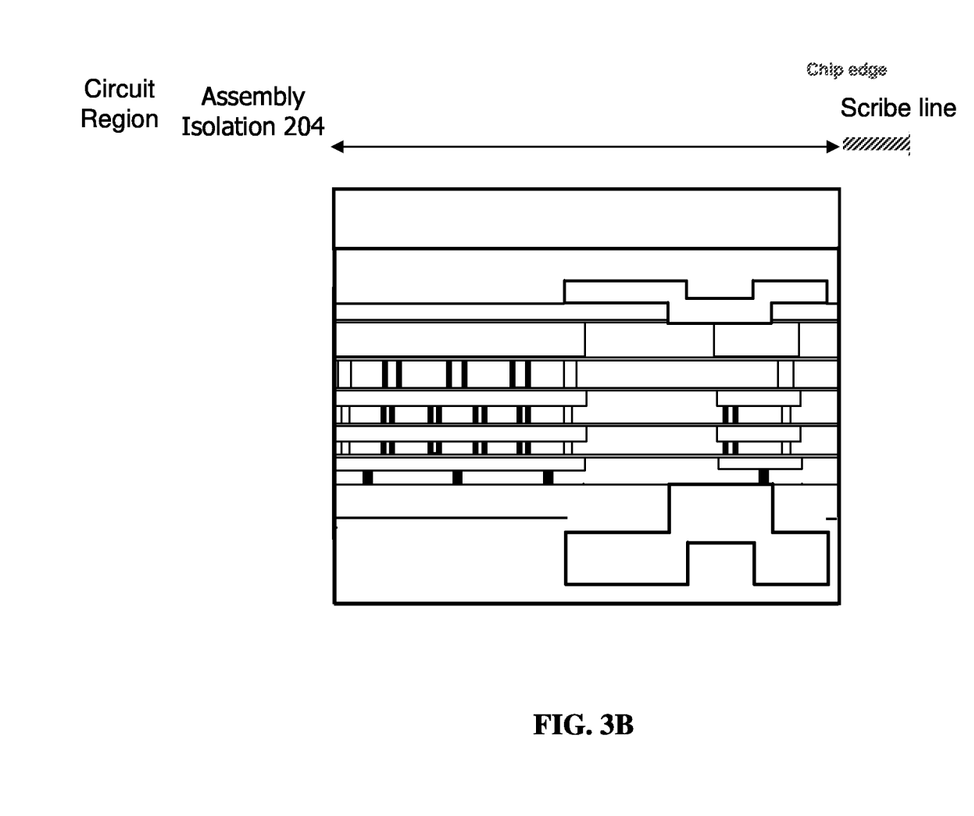
Figure 4:
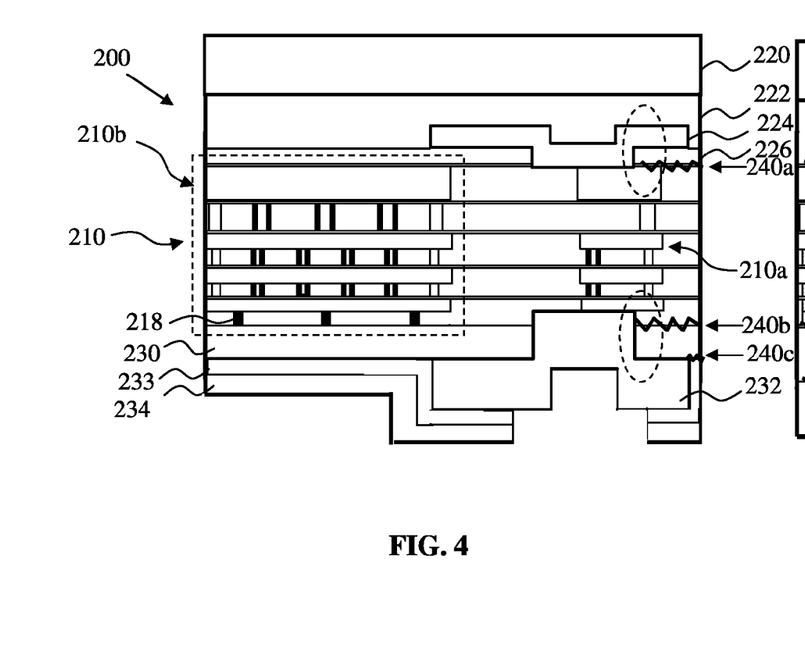
FIG. 4 is a cross-sectional view of an embodiment of the device showing blocked die saw effects according to various aspects of the present disclosure.
Figure 5:
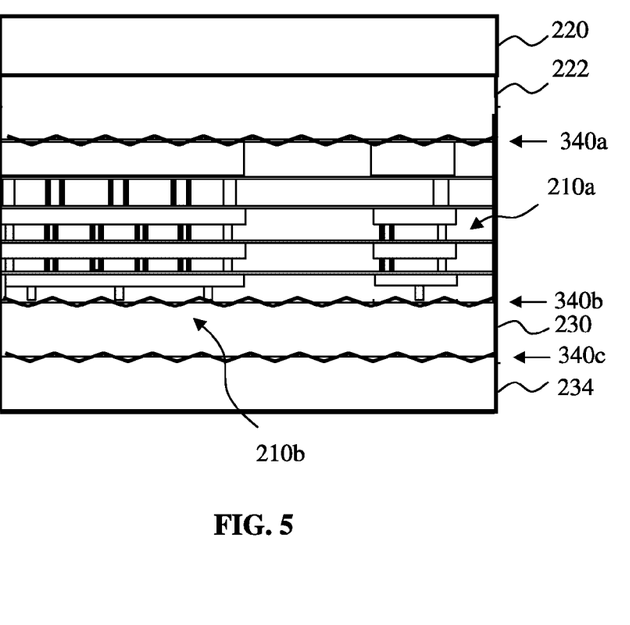
FIG. 5 is a cross-sectional view of a previous seal ring structure showing die saw effects on the previous semiconductor device.

Referring to the figures, FIG. 1 illustrates a flowchart of a method 100 for fabricating a semiconductor device with a seal ring structure having a metal pad for preventing or blocking die saw peeling effects on the device according to various aspects of the present disclosure. FIG. 2 is a top plan view of a semiconductor device including an integrated circuit (IC) die and a seal ring structure around the IC die according to various aspects of the present disclosure. FIGS. 3A and 3B are cross-sectional views of alternative embodiments of the seal ring structure 210 according to various aspects of the present disclosure. FIG. 4 is a cross-sectional view of an embodiment of the seal ring structure of FIG. 3 showing blocked die saw effects on the semiconductor device according to various aspects of the present disclosure. In contrast, FIG. 5 illustrates a cross-sectional view of a previous seal ring structure showing die saw peeling effects on the device. FIGS. 6A through 6F illustrate cross-sectional views of the semiconductor device at various stages of fabrication according to aspects of the present disclosure.

It is noted that similar features may be similarly numbered for the sake of simplicity and clarity. It is further noted that part of the semiconductor device 200 may be fabricated with a CMOS process flow. Accordingly, it is understood that additional processes may be provided before, during, and after the method 100 of FIG. 1, and that some other processes may only be briefly described herein. The semiconductor device 200 may be fabricated to include a backside illuminated (BSI) device having an interlayer dielectric (ILD) such as a low-k inter-metal dielectric (IMD).

Referring now to FIG. 1, method 100 begins with block 102 in which a semiconductor substrate is provided having a seal ring region and a circuit region. In an embodiment, the seal ring region is formed around the circuit region, and the seal ring region is for forming a seal ring structure thereon and the circuit region is for at least forming a transistor device therein. The method 100 continues with block 104 in which an integrated circuit is formed over the circuit region and a seal ring structure is formed over the seal ring region. The method 100 continues with block 106 in which a first frontside passivation layer is formed over the seal ring structure in the seal ring region, and with block 108 in which a frontside aperture is etched in the first frontside passivation layer adjacent to an exterior portion of the seal ring structure. The method continues with block 110 in which a frontside metal pad is formed in the frontside aperture of the first frontside passivation layer to couple the first metal pad to the exterior portion of the seal ring structure. At block 112, a second frontside passivation layer is formed above the frontside metal pad, and at block 114, backside processing is performed including wafer bonding of the second frontside passivation layer to a carrier wafer and substrate etching to thin the substrate.

The method 100 continues with block 116 in which a first backside passivation layer is formed under the seal ring structure, and with bock 118 in which a backside aperture is etched in the first backside passivation layer adjacent to the exterior portion of the seal ring structure. At block 120, a backside metal pad is formed in the backside aperture of the first backside passivation layer to couple the backside metal pad to the exterior portion of the seal ring structure. At block 122, a second backside passivation layer is formed under the backside metal pad. Other layers, lines, vias, and structures may also be provided before, during, or after the steps of method 100. Advantageously, because the metal pads are coupled to the exterior portion of the seal ring structure and their respective passivation layers, die saw peeling effects are blocked from affecting an interior portion of the seal ring structure and therefore the integrated circuit is also protected.

Referring now to FIG. 2, a top plan view of a device 200 is illustrated including an integrated circuit (IC) die 202, a seal ring structure 210 around the IC die 202, and an assembly isolation region 204 therebetween according to various aspects of the present disclosure. Alternative cross-sectional views of the seal ring region along line I-I' are illustrated in FIGS. 3A and 3B.

Referring now to FIG. 3A in conjunction with FIG. 2, a cross-sectional view of an embodiment of semiconductor device 200 at a stage of fabrication according to the method 100 of FIG. 1 is illustrated. The semiconductor device 200 may include a semiconductor substrate 230 such as a silicon substrate (e.g., a p-doped substrate) having a seal ring region 201 and assembly isolation region 204 surrounding IC die 202 in a circuit region. In an embodiment, the seal ring region 201 is formed around the circuit region, and the seal ring region is for forming a seal ring structure thereon and the circuit region is for forming at least a transistor device therein. The substrate 230 may alternatively include silicon germanium, gallium arsenic, or other suitable semiconductor materials. The substrate 230 may further include doped regions, such as a P-well, an N-well, and/or a doped active region such as a P+ doped active region. In one aspect, the doped active regions may be disposed within other regions. The substrate 230 may further include other features such as a buried layer, and/or an epitaxy layer. Furthermore, the substrate 230 may be a semiconductor on insulator such as silicon on insulator (SOI). In other embodiments, the semiconductor substrate 230 may include a doped epitaxy layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure.

The device 200 may further include isolation structures, such as shallow trench isolation (STI) features or LOCOS features formed in the substrate 230 for isolating active regions from other regions of the substrate. The active regions may be configured as an NMOS device (e.g., nFET) or as a PMOS device (e.g., pFET) in one example.

The device 200 may further include dummy gate and/or gate structures (not shown) overlying the substrate 230, which may be formed from various material layers and by various etching/patterning techniques over various regions of device 200.

The device 200 further includes contact bars 218 to electrically couple active regions to the subsequently formed seal ring structure 210 (including an exterior portion 210*a* and an interior portion 210*b*). It is noted that other layers may be provided in the seal ring region to form various features over and/or under the seal ring structure such as passivation layers, nitride layers, and polyimide layers deposited by CVD, spin-on techniques, or the like.

The semiconductor substrate 230 may further include underlying layers, overlying layers, devices, junctions, and other features formed during prior process steps or which may be formed during subsequent process steps.

Device 200 includes seal ring structure 210 disposed over substrate 230 in the seal ring region 201. Seal ring structure 210 may be comprised of various stacked conductive layers 212 and via layers 214 disposed through dielectric layers 216, and may have a width between about 5 microns and about 15 microns in one example. Seal ring structure 210 is further comprised of an exterior portion 210*a* adjacent the chip edge and scribe line and an interior portion 210*b* adjacent the assembly isolation 204 and the circuit region.

A first frontside passivation layer 226 is disposed over the seal ring structure 210. In one example, the first frontside passivation layer 226 may be deposited by a high aspect ratio process (HARP) and/or a high density plasma (HDP) CVD process. In one example, the first frontside passivation layer 226 includes a dielectric and is an oxide.

Device 200 further includes a first metal pad or frontside metal pad 224 in the first frontside passivation layer 226. The first metal pad or frontside metal pad 224 is coupled to exterior portion 210*a* of the seal ring structure 210, and in one example the frontside metal pad 224 is coupled to a top metal layer of the exterior portion 210*a* of the seal ring structure 210. In one example, frontside metal pad 224 may be comprised of aluminum and the metal layers of the seal ring structure may be comprised of copper. Other metals may be applicable.

A second frontside passivation layer 222 may be disposed over the frontside metal pad 224 and the first frontside passivation layer 226. A carrier wafer 220 may then be bonded to the second frontside passivation layer 222.

In one embodiment, substrate 230 may include an underlying first backside passivation layer as a bottom layer in the seal ring region. In one example, the first backside passivation layer may be formed by deposition of an oxygen dopant or deposition of a passivation layer by a high aspect ratio process (HARP) and/or a high density plasma (HDP) CVD process. In one example, the first backside passivation layer includes a dielectric (ILD or IMD) and is an oxide. Furthermore, in one example, the substrate 230 may be thinned by an etch prior to the formation of the first backside passivation layer.

Device 200 further includes a second metal pad or backside metal pad 232 in the substrate 230 (e.g., a first backside passivation layer). In this embodiment, the backside metal pad 232 is directly coupled to exterior portion 210*a* of the seal ring structure 210, and in one example the backside metal pad 232 is directly coupled to a bottom metal layer of the exterior portion 210*a* of the seal ring structure 210. In one example, backside metal pad 232 may be comprised of aluminum and the metal layers of the seal ring structure may be comprised of copper. Other metals may be applicable.

A second backside passivation layer 233, 234 may be disposed over the second metal pad or backside metal pad 232 and the substrate 230. In one example, backside passivation layer 233 may be comprised of silicon oxide and backside passivation layer 234 may be comprised of silicon nitride. The metal pads and various passivation layers may undergo patterning and etch steps to form the structure profiles as desired.

It is understood that the semiconductor device 200 may undergo further processing in the circuit region to form various features such as contacts/vias, interconnect metal layers, interlayer dielectric, passivation layers, etc. to form semiconductor circuits as is known in the art. It is further understood that in some embodiments, semiconductor device 200 may only include a frontside metal pad or a backside metal pad and not both metal pads.

Referring now to FIG. 3B, an alternative embodiment of the seal ring structure 210 and device 200 are illustrated. The various structures are substantially similar to the embodiment disclosed in FIG. 3A and the descriptions of common structures are not repeated here although fully applicable in this embodiment as well. In this embodiment, second metal pad or backside metal pad 232 is not directly coupled to the bottom metal layer of the exterior portion 210a of the seal ring structure 210. Instead, backside metal pad 232 is coupled to contact 218 which is coupled to the bottom metal layer of the seal ring structure. Accordingly, backside metal pad 232 is electrically coupled to the seal ring structure but indirectly through contact 218.

Referring now to FIGS. 4 and 5, FIG. 4 is a cross-sectional view of an embodiment of the seal ring structure of FIG. 3A showing blocked die saw effects on the semiconductor device 200 according to various aspects of the present disclosure, and in contrast, FIG. 5 illustrates a cross-sectional view of a previous seal ring structure showing die saw peeling effects on the device. Die saw effects, as illustrated by jagged lines 240a through 240c, are blocked by the metal pads 224 and 232 at the exterior portion 210a of the seal ring structure, thereby protecting the interior portion 210b of the seal ring structure from die saw peeling effects and thereby protecting the interior circuit device from layer peeling. The metal pads 224 and 232, which are coupled to and contact the exterior portion of the seal ring structure and which are further coupled to the frontside and backside passivation layers, respectively, block the die saw peeling effects from traversing to the interior portion of the seal ring structure and the interior circuit device.

In contrast, FIG. 5 illustrates die saw peeling effects as shown by the jagged lines 340a through 340c traversing to the interior portion 210b of the seal ring structure because of the lack of metal pads 224 and/or 232 (FIG. 4). In particular, FIG. 5 illustrates die saw peeling effects 340a-340c shown along the interfaces of the passivation layers 222, 230, and 234 but FIG. 4 illustrates die saw peeling effects 240a-240c blocked by metal pads 224 and 232. In one embodiment, a diamond cutter instead of a laser may be used to cut along the scribe lines of a device having seal ring structures including metal pads according to aspects of the present disclosure, thereby reducing manufacturing costs.

Figure 6A:
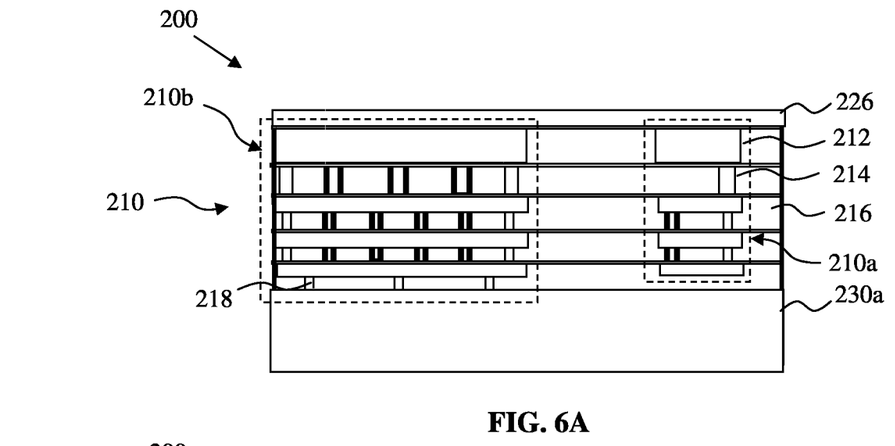
FIGS. 6A-6F are cross-sectional views of the semiconductor device at various stages of fabrication according to various aspects of the present disclosure.

FIGS. 6A through 6F illustrate cross-sectional views of the device 200 at various stages of fabrication according to aspects of the present disclosure. FIG. 6A illustrates the forming of a substrate 230a, a seal ring structure 210 over the seal ring region, and a first passivation layer 226 over the seal ring structure 210. In this embodiment, a contact 218 is removed under the exterior portion 210a of the seal ring structure 210, although in other embodiments contact 218 may remain under the exterior portion 210a of the seal ring structure 210.

Figure 6B:
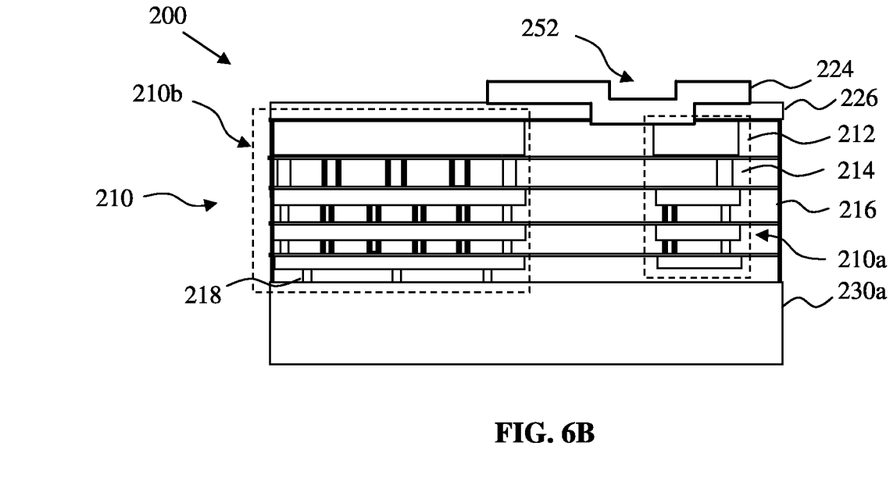

FIG. 6B illustrates an etch of the first passivation layer 226 to form a frontside aperture 252 and then the deposition and etch of a metal in the frontside aperture 252 to form first metal pad or frontside metal pad 224. The frontside aperture 252 is adjacent to a top metal layer of the exterior portion 210a of the seal ring structure, and the frontside metal pad 224 is directly coupled to the top metal layer of seal ring exterior portion 210a.

Figure 6C:
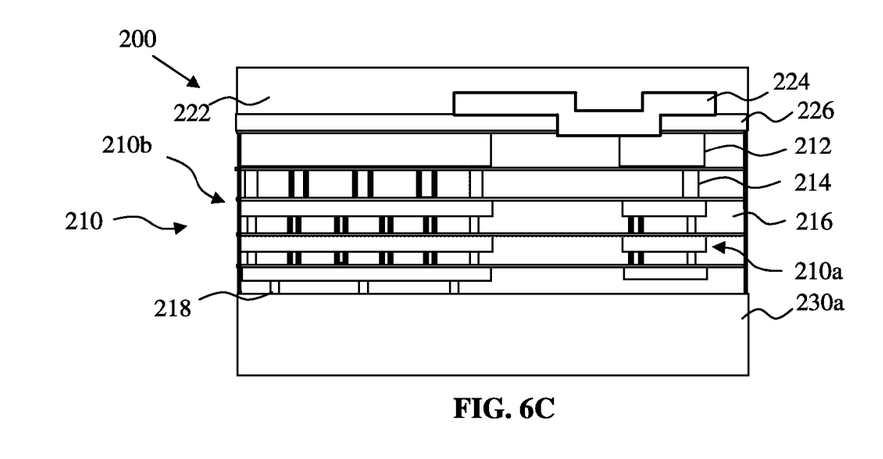

FIG. 6C illustrates the forming of a second frontside passivation layer 222 over frontside metal pad 224 and the first frontside passivation layer 226.

Figure 6D:
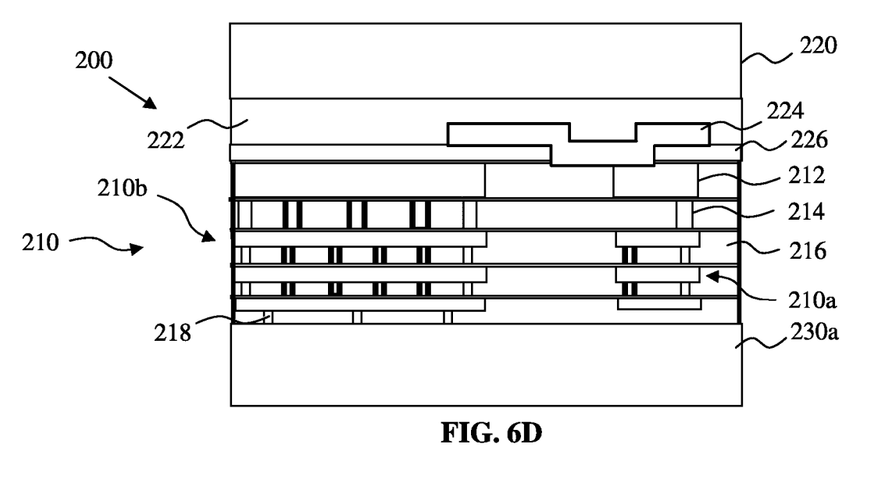

FIG. 6D illustrates backside processing including the bonding of carrier wafer 220 to the second frontside passivation layer 222, and an etch of substrate 230a to thin the substrate layer.

Figure 6E:
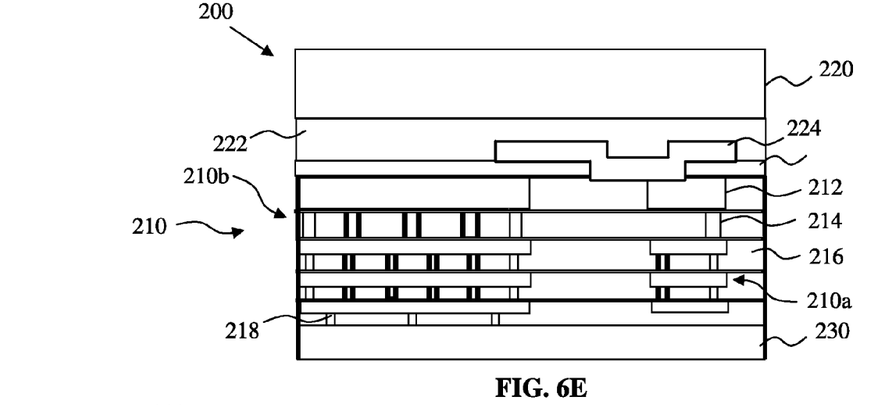

FIG. 6E illustrates the subsequent forming of first backside passivation layer 230 under the seal ring structure. In one embodiment, first backside passivation layer 230 formed by deposition of an oxygen dopant or deposition of a passivation layer by a high aspect ratio process (HARP) and/or a high density plasma (HDP) CVD process. In one example, the first backside passivation layer includes a dielectric (ILD or IMD) and is an oxide.

Figure 6F:
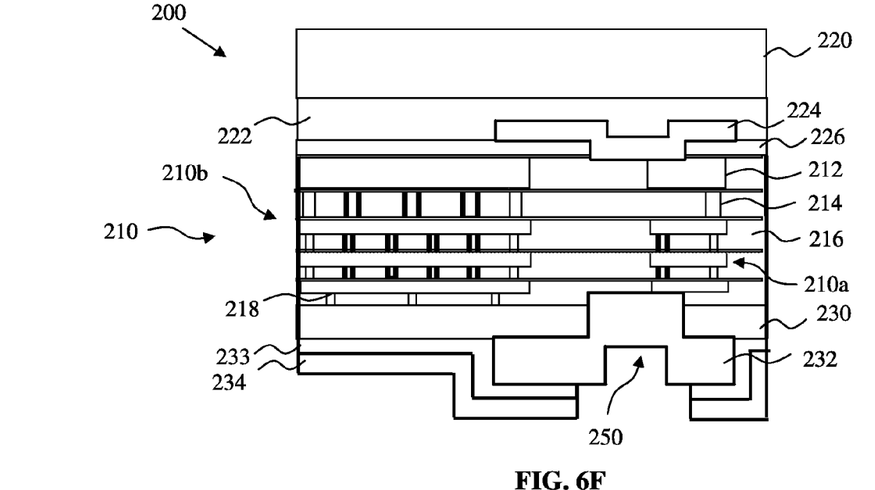

FIG. 6F illustrates an etch of the second passivation layer 230 to form a backside aperture 250 and then the deposition and etch of a metal in the second aperture 250 to form second metal pad or backside metal pad 232. The second aperture 250 is adjacent to a bottom metal layer of the exterior portion 210a of the seal ring structure, and the backside metal pad 232 is directly coupled to the bottom metal layer of exterior portion 210a. FIG. 6F further illustrates the forming of passivation layers 233 and 234 below backside metal pad 232 and second passivation layer 230.

In one example, the metal pads 224 and 232 are deposited in respective apertures by CVD, PVD, or other suitable process, and subsequently patterned, for example by standard photolithography patterning and etch techniques. In a further example, metal pads 224 and 232 are comprised of aluminum although other metals, such as titanium, tungsten, copper, may be applicable.

The present disclosure provides for many different embodiments and the methods, techniques, and structures of the present disclosure may be used in a CMOS image sensor (CIS) backside illuminated (BSI) product, and products which need wafer bonding processes such as in microelectro-mechanical systems (MEMS) products. Furthermore, semiconductor devices may be formed having a frontside metal pad coupled to a seal ring structure, a backside metal pad coupled to a seal ring structure, or both metal pads coupled to a seal ring structure.

One of the broader forms of the present disclosure involves a semiconductor device. The semiconductor device includes a substrate having a seal ring region and a circuit region, a seal ring structure disposed over the seal ring region, a first frontside passivation layer disposed above the seal ring structure, and a frontside metal pad in the first frontside passivation layer, the frontside metal pad coupled to an exterior portion of the seal ring structure. The device further includes a second frontside passivation layer disposed above the frontside metal pad, a carrier wafer bonded to the second frontside passivation layer, and a first backside passivation layer disposed below the seal ring structure.

Another of the broader forms of the present disclosure involves a semiconductor device including a substrate having a seal ring region and a circuit region, a seal ring structure disposed in the seal ring region, a first frontside passivation layer disposed above the seal ring structure, a first backside passivation layer below the seal ring structure, and backside metal pad in the first backside passivation layer, the backside metal pad coupled to the exterior portion of the seal ring structure. The device further includes a second backside passivation layer disposed below the backside metal pad.

Another of the broader forms of the present disclosure involves a semiconductor device including a substrate having a seal ring region and a circuit region, a seal ring structure disposed over the seal ring region, a first passivation layer disposed over the seal ring structure, and a first metal pad in the first passivation layer, the first metal pad coupled to an exterior portion of the seal ring structure. The device further includes a second passivation layer disposed under the seal ring structure, and a second metal pad in the second passivation layer, the second metal pad coupled to the exterior portion of the seal ring structure.

Another of the broader forms of the present disclosure involves a method of fabricating a semiconductor device. The method includes providing a substrate having a seal ring region and a circuit region, forming a seal ring structure over the seal ring region, forming a first frontside passivation layer above the seal ring structure, etching a frontside aperture in the first frontside passivation layer adjacent to an exterior portion of the seal ring structure, and forming a frontside metal pad in the frontside aperture to couple the frontside metal pad to the exterior portion of the seal ring structure. The method further includes forming a first backside passivation layer below the seal ring structure, etching a backside aperture in the first backside passivation layer adjacent to the exterior portion of the seal ring structure, and forming a backside metal pad in the backside aperture to couple the backside metal pad to the exterior portion of the seal ring structure.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, the method comprising:
    providing a substrate having a seal ring region and a circuit region;
    forming a seal ring structure over the seal ring region;
    forming first and second frontside passivation layers above the seal ring structure;
    forming a frontside metal pad between the first and second frontside passivation layers;
    forming a first backside passivation layer below the seal ring structure; and
    after forming the frontside metal pad between the first and second frontside passivation layers, bonding a carrier wafer to the second frontside passivation layer.

2. The method of claim 1, wherein forming the frontside metal pad comprises:
    etching a frontside aperture in the first frontside passivation layer adjacent to an exterior portion of the seal ring structure; and
    forming the frontside metal pad in the frontside aperture.

3. The method of claim 2, wherein the frontside metal pad is coupled to the exterior portion of the seal ring structure.

4. The method of claim 1, wherein the frontside metal pad is directly coupled to a top metal layer of the seal ring structure.

5. The method of claim 1, further comprising:
    etching a backside aperture in the first backside passivation layer adjacent to an exterior portion of the seal ring structure; and
    forming a backside metal pad in the backside aperture to couple the backside metal pad to the exterior portion of the seal ring structure.

6. The method of claim 5, further comprising:
    forming a second backside passivation layer under the backside metal pad.

7. The method of claim 5, wherein the backside metal pad is coupled to a bottom metal layer of the seal ring structure or coupled to a contact that is coupled to the bottom metal layer of the seal ring structure.

8. A method of fabricating a semiconductor device, the method comprising:
    providing a substrate having a seal ring region and a circuit region;
    forming a seal ring structure over the seal ring region;
    forming a first frontside passivation layer above the seal ring structure;
    etching a frontside aperture in the first frontside passivation layer adjacent to an exterior portion of the seal ring structure;
    forming a frontside metal pad in the frontside aperture to couple the frontside metal pad to the exterior portion of the seal ring structure;
    forming a second frontside passivation layer above the frontside metal pad;
    bonding a carrier wafer to the second frontside passivation layer such that the carrier wafer physically contacts the second frontside passivation layer;
    forming a first backside passivation layer below the seal ring structure;
    etching a backside aperture in the first backside passivation layer adjacent to the exterior portion of the seal ring structure; and
    forming a backside metal pad in the backside aperture to couple the backside metal pad to the exterior portion of the seal ring structure.

9. The method of claim 8, wherein the frontside metal pad is coupled to a top metal layer of the seal ring structure.

10. The method of claim 8, wherein the backside metal pad is coupled to a bottom metal layer of the seal ring structure.

11. The method of claim 8, further comprising:
    forming a second backside passivation layer below the backside metal pad such that the second backside passivation layer is position further away from the backside metal pad than the first backside passivation layer.

12. A semiconductor device, comprising:
    a substrate having a seal ring region and a circuit region;
    a seal ring structure disposed over the seal ring region;
    a first frontside passivation layer and a second frontside passivation layer, each disposed above the seal ring structure, with a frontside metal pad between the first and second frontside passivation layers, wherein the frontside metal pad has a recess and the second passivation layer completely fills the recess; and
    a first backside passivation layer disposed below the seal ring structure.

13. The semiconductor device of claim 12, wherein the seal ring structure is comprised of a stack of metal layers disposed around the circuit region.

14. The semiconductor device of claim 12, wherein the frontside metal pad is directly coupled to a top metal layer of the seal ring structure.

15. The semiconductor device of claim 12, wherein the frontside metal pad is in the first frontside passivation layer and is coupled to an exterior portion of the seal ring structure.

16. The semiconductor device of claim 15, further comprising:
   a backside metal pad in the first backside passivation layer, the backside metal pad coupled to the exterior portion of the seal ring structure; and
   a second backside passivation layer disposed below the backside metal pad.

17. The semiconductor device of claim 16, wherein the first backside passivation layer comprises silicon oxide and the second backside passivation layer comprises silicon nitride.

18. The semiconductor device of claim 16, wherein the backside metal pad is either directly coupled to a bottom metal layer of the seal ring structure or coupled to a contact that is coupled to the bottom metal layer of the seal ring structure.

19. The semiconductor device of claim 16, wherein the backside metal pad comprises aluminum.

20. The method of claim 1, wherein bonding the carrier wafer to the second frontside passivation layer includes the carrier wafer physically contacting the second frontside passivation layer.

* * * * *